(12) United States Patent
Kawamoto et al.

(10) Patent No.: US 10,023,775 B2
(45) Date of Patent: Jul. 17, 2018

(54) FILM ADHESIVE AND SEMICONDUCTOR DEVICE INCLUDING THE SAME

(71) Applicant: NAMICS Corporation, Niigata (JP)

(72) Inventors: Satomi Kawamoto, Niigata (JP); Yoshihide Fukuhara, Niigata (JP); Hiromi Saito, Niigata (JP); Atsushi Saito, Niigata (JP); Toyokazu Hotchi, Niigata (JP)

(73) Assignee: NAMICS Corporation, Niigata (JP)

(*) Notice: Subject to any disclaimer, the term of this patent is extended or adjusted under 35 U.S.C. 154(b) by 0 days.

(21) Appl. No.: 15/545,929

(22) PCT Filed: Jan. 12, 2016

(86) PCT No.: PCT/JP2016/050624
§ 371 (c)(1),
(2) Date: Jul. 24, 2017

(87) PCT Pub. No.: WO2016/125537
PCT Pub. Date: Aug. 11, 2016

(65) Prior Publication Data
US 2018/0016479 A1    Jan. 18, 2018

(30) Foreign Application Priority Data

Feb. 2, 2015 (JP) .................... 2015-018702

(51) Int. Cl.
| | | |
|---|---|---|
| C09J 163/04 | (2006.01) | |
| C09J 11/06 | (2006.01) | |
| C08K 3/36 | (2006.01) | |
| C08K 5/3445 | (2006.01) | |
| C08K 5/3437 | (2006.01) | |
| C09J 11/04 | (2006.01) | |
| C09J 7/00 | (2018.01) | |

(52) U.S. Cl.
CPC .............. C09J 163/04 (2013.01); C08K 3/36 (2013.01); C08K 5/3437 (2013.01); C08K 5/3445 (2013.01); C09J 11/04 (2013.01); C09J 11/06 (2013.01); C09J 7/00 (2013.01); H01L 2224/83101 (2013.01)

(58) Field of Classification Search
CPC . C09J 163/04; C09J 11/06; C09J 11/04; C09J 7/00; C08K 3/36; C08K 5/3445; C08K 5/3437; H01L 2224/83101
USPC ...................................................... 257/737
See application file for complete search history.

(56) References Cited

U.S. PATENT DOCUMENTS

| | | |
|---|---|---|
| 6,344,157 B1 | 2/2002 | Cheng |
| 2010/0044088 A1 | 2/2010 | Watanabe |
| 2011/0221075 A1 | 9/2011 | Meura et al. |
| 2012/0156502 A1 | 6/2012 | Maejima |
| 2012/0199988 A1 | 8/2012 | Meura et al. |
| 2014/0346684 A1 | 11/2014 | Kojima |
| 2018/0016479 A1* | 1/2018 | Kawamoto ............ C09J 163/04 |

FOREIGN PATENT DOCUMENTS

| | | | | |
|---|---|---|---|---|
| JP | 11284114 | A2 | 10/1999 | |
| JP | 2000017240 | A2 | 1/2000 | |
| JP | 2002348486 | A2 | 12/2002 | |
| JP | 2006225426 | A2 | 8/2006 | |
| JP | 2012067302 | A2 | 4/2012 | |
| JP | 2013122957 | A2 | 6/2013 | |
| JP | 2013171927 | A2 | 9/2013 | |
| JP | 2015137299 | A2 | 7/2015 | |
| JP | 2016-141739 | A * | 8/2016 | ............... C09J 7/00 |
| WO | 2008004287 | A1 | 1/2008 | |
| WO | 2010052871 | A1 | 5/2010 | |
| WO | 2010073583 | A1 | 7/2010 | |
| WO | 2011033743 | A1 | 3/2011 | |
| WO | 2011048774 | A1 | 4/2011 | |
| WO | 2016/125537 | A1 * | 8/2016 | ............... C09J 7/00 |

OTHER PUBLICATIONS

International Search Report dated Apr. 12, 2016 filed in PCT/JP2016/050624.

* cited by examiner

Primary Examiner — Alexander Oscar Williams
(74) Attorney, Agent, or Firm — Rankin, Hill & Clark LLP

(57) ABSTRACT

Provided is a film adhesive which is preferably used as a NCF, void-free, has excellent electrical connectivity and its high reliability, does not develop cracks easily, and has high surface flatness. Also provided is a semiconductor device in which the film adhesive according to the present invention is used as an NCF during the manufacture of the semiconductor device. The film adhesive according to the present invention contains (A) an epoxy resin; (B) a bisphenol F type phenoxy resin; (C) a phenol resin-based curing agent; (D) a modified imidazole compound; (E) a silica filler; (F) oxyquinoline; and (G) a butadiene-acrylonitrile-methacrylic acid copolymer. The content of component (A) is 19.3 to 33.8 parts by mass. The content of component (B) is 7.5 to 9.1 parts by mass. The content of component (D) is 1.915 to 5 parts by mass. The content of component (E) is 30 to 60 parts by mass. The content of component (F) is 2.5 to 10 parts by mass. The liquid epoxy resin of component (A) contains a phenol novolac type epoxy resin and a liquid epoxy resin. The ratio of phenol novolac type epoxy resin to the epoxy resin of component (A) is not less than 46%. The equivalent ratio of component (C) relative to component (A) is 0.25 to 0.75.

17 Claims, No Drawings

FILM ADHESIVE AND SEMICONDUCTOR DEVICE INCLUDING THE SAME

TECHNICAL FIELD

The present invention relates to a film adhesive used as a non-conductive film (NCF) at the time of mounting a semiconductor, and a semiconductor device including the same.

BACKGROUND ART

Conventionally, a flip chip method is used for mounting semiconductors. In this method, the face on which electrodes (bumps) are formed of an integrated circuit (IC) chip and the face on which electrodes (electrode pads) are formed of a substrate are provided to face each other. Then, the IC chip bumps and the substrate electrode pads are electrically connected.

In the flip chip method, normally, a liquid thermosetting adhesive referred to as "underfill," which is introduced into the gap between the semiconductor chip and the substrate, is cured after the electrodes are interconnected. In this way, the electrode interconnected portion is protected from the outside, and further a stress caused by a difference in linear coefficient of expansion between the IC chip and the substrate is absorbed.

In recent years, IC chips have become increasingly miniaturized. Correspondingly, the pitch between adjacent electrodes and the gap between the semiconductor chip and the substrate are becoming increasingly narrower. As a result, when the underfill is introduced into the gap between the IC chip and the substrate using capillary action, voids may develop, or the time it takes to introduce the underfill may become longer.

To address these problems, a so-referred to as first-in method has been proposed (see Patent Literature 1). In this method, a liquid adhesive referred to as non-conductive paste (NCP), or a film-shaped adhesive referred to as non-conductive film (NCF) is coated onto or affixed to the substrate in advance. Thereafter, the resin is cured by thermal pressurization using a thermal pressurization bonder and the like. In this way, the IC chip bumps and the substrate electrode pads are interconnected.

As the IC chips have become miniaturized, copper bumps, which allows for a decrease in the diameter of the bumps, are becoming more popular as the bump material.

As electronic devices have become smaller in size and more complex in their functions in recent years, a configuration in which a plurality of semiconductor chips are mounted in a single semiconductor package has become widely used. As a mounting configuration, a so-called chip-stack technique is widely used. According to the chip-stack technique, chips are three-dimensionally stacked and electrically interconnected by wire bonding. This makes it possible to reduce the size of the semiconductor package compared with the method whereby a plurality of chips are disposed on the substrate two-dimensionally. The chip-stacking employs a paste-like or film-shaped adhesive. However, a paste-like adhesive has high flowability, and is therefore associated with possible electrode contamination. Accordingly, generally, a film-shaped adhesive is used. Meanwhile, as a semiconductor chip interconnect technique to handle further decrease in size and thickness of chip-stack packages, and high speed transmission, a flip chip interconnect technique is gaining attention. Proposed flip chip mounting techniques include an interconnect technique using ultrasonic bonding or anisotropic conductive adhesive (see Patent Literature 2).

The characteristics required for the film adhesive used as NCF include the absence of voids, and excellent electrical connectivity and its high reliability. Other required film characteristics include cracks not being readily caused and high surface flatness. The film adhesive also requires high workability when used as NCF, i.e., ease of handling.

As mentioned above, copper bumps have small diameters. This means that the interconnect strength per bump is low. Accordingly, reliability of electrical interconnection is particularly important. In addition, the miniaturized IC chips means smaller pitches between adjacent electrodes and smaller gaps between the IC and the substrate. Accordingly, if there are voids, a decrease in interconnect strength and short-circuit defect between wires become more likely. Thus, the absence of voids is particularly important.

The film adhesive used as NCF for the purpose of interconnection by soldering is required to contain a flux activator as an indispensable component for performing satisfactory interconnection by soldering. The flux activator is a component which, through reduction of oxide films on solder and a metal surface to be bonded, enhances wettability and increases the interconnect reliability between a semiconductor element and the substrate, for example.

Patent Literature 2 mentioned above does not indicate that the film adhesive being discussed therein contains a flux activator.

In an adhesive film disclosed in Patent Literature 3, a phenolic hydroxyl compound and a carboxylic compound are indicated as examples of a flux activation compound. However, if a film adhesive containing these exemplary compounds as a flux activator is used as NCF, the following problem may be encountered.

When the IC chip bumps and the substrate electrode pads are interconnected by the above-described procedure using NCF, a shorter thermal pressurization time is preferable from the viewpoint of production efficiency. However, if the adhesive film disclosed in Patent Literature 3 is used as NCF, it takes 30 seconds at 235° C., meaning that production efficiency is low.

CITATION LIST

Patent Literature

PATENT LITERATURE 1: JP-A-2013-122957
PATENT LITERATURE 2: JP-A-2012-67302
PATENT LITERATURE 3: International Publication Number WO2010/073583

SUMMARY OF THE INVENTION

Problems to be Solved by the Invention

In order to solve the problems of the conventional art, an object of the present invention is to provide a film adhesive which is void-free, provides excellent electrical connectivity and its high reliability, does not develop cracks easily, and has high surface flatness, and which can be preferably used as a NCF. Another object of the present invention is to provide a semiconductor device in which, during the manufacture of the semiconductor device, a film adhesive according to the present invention is used as an NCF.

Solution to the Problems

In order to achieve the purpose described above, the present invention provides a film adhesive which contains:

(A) an epoxy resin;
(B) a bisphenol F type phenoxy resin;
(C) a phenol resin-based curing agent;
(D) a modified imidazole compound;
(E) a silica filler;
(F) oxyquinoline; and
(G) a butadiene-acrylonitrile-methacrylic acid copolymer, in which:
the content of component (A) is 19.3 to 33.8 parts by mass;
the content of component (B) is 7.5 to 9.1 parts by mass;
the content of component (D) is 1.9 to 5 parts by mass;
the content of component (E) is 30 to 60 parts by mass;
the content of component (F) is 2.5 to 10 parts by mass;
the content of component (G) is 0.7 to 2.3 parts by mass;
the epoxy resin of component (A) contains a phenol novolac type epoxy resin and a liquid epoxy resin;
the phenol novolac type epoxy resin has a ratio of not less than 46% to the epoxy resin of component (A); and
component (C) has an equivalent ratio of 0.25 to 0.75 relative to component (A).

The film adhesive according to the present invention may further contain (H) a silane coupling agent.

In the film adhesive according to the present invention, the phenol resin-based curing agent of component (C) is preferably a cresol novolac type phenol resin.

In the film adhesive according to the present invention, it is preferable that the film adhesive have a liquid component of 18 to 33 parts by mass relative to 100 parts by mass of a solid resin component contained in the film adhesive.

In the film adhesive according to the present invention, it is preferable that the film adhesive have a content ratio of 70 to 85 of a solid resin component relative to a total amount of component (A), component (B), component (C), component (D), and component (G).

In addition, the present invention provides a semiconductor device in which the film adhesive according to the present invention is used as an NCF during the manufacturing of the semiconductor device.

Preferably, the semiconductor device according to the present invention includes a copper bump.

Effects of the Invention

The film adhesive according to the present invention is void-free, has excellent electrical connectivity and its high reliability, does not develop cracks easily, has excellent surface flatness, and has excellent workability when used as a NCF, i.e., ease of handling. Accordingly, the film adhesive can be preferably used as an NCF, particularly as an NCF used during the manufacture of a semiconductor device having a copper bump.

DESCRIPTION OF THE EMBODIMENTS

In the following, a film adhesive according to the present invention will be described in detail.

The film adhesive according to the present invention contains components (A) to (G) indicated below as indispensable components.

(A) Epoxy Resin

An epoxy resin of component (A) is a base compound component of the film adhesive according to the present invention.

The film adhesive according to the present invention contains, as component (A), a phenol novolac type epoxy resin, and a liquid epoxy resin.

The phenol novolac type epoxy resin is used as component (A) because it makes it possible to obtain a cured product having high crosslink density, and characteristics such as thermal resistance and chemical resistance.

The phenol novolac type epoxy resin as component (A), from the viewpoint of film formability and mountability, preferably has the softening point of 0 to 70° C. and more preferably 10 to 65° C.

The liquid epoxy resin used as component (A) refers to an epoxy resin which is liquid at normal temperature. A liquid epoxy resin is used as component (A) in addition to the phenol novolac type epoxy resin because the use of a liquid epoxy resin makes it possible to decrease the viscosity of NCF at the time of heating while the characteristics such as adhesiveness and humidity resistance are afforded. In addition, the use makes it possible to lower viscosity at the time of affixing the NCF and mounting of the semiconductor component. As a result, workability such as mountability is improved, and the NCF can be provided with proper flexibility.

Examples of the liquid epoxy resin used as component (A) according to the present invention include: branched multifunctional bisphenol A epoxy resin such as bisphenol A epoxy resin having an average molecular weight of not more than about 400 and p-glycidyloxyphenyl dimethyl tris bisphenol A diglycidyl ether; bisphenol F type epoxy resin; phenol novolac type epoxy resin having an average molecular weight of not more than about 570; alicyclic epoxy resin such as vinyl (3,4-cyclohexene) dioxide, 3,4-epoxy cyclohexyl carboxylic acid (3,4-epoxy cyclohexyl) methyl, adipic acid bis (3,4-epoxy-6-methyl cyclohexyl methyl), and, 2-(3,4-epoxy cyclohexyl) 5,1-spiro (3,4-epoxy cyclohexyl)-m-dioxane; biphenyl type epoxy resin such as 3,3',5,5'-tetra methyl-4,4'-diglycidyl oxybiphenyl; glycidyl ester type epoxy resin such as hexahydrophthalic acid diglycidyl, 3-methyl hexahydrophthalic acid diglycidyl, and hexahydroterephthalic acid diglycidyl; glycidyl amine type epoxy resin such as diglycidyl aniline, diglycidyl toluidine, triglycidyl-p-amino phenol, tetra glycidyl-m-xylylene diamine, and tetra glycidyl bis (amino methyl) cyclohexane; hydantoin type epoxy resin such as 1,3-diglycidyl-5-methyl-5-ethyl hydantoin; and naphthalene ring-cotaining epoxy resin. Epoxy resin having a silicone framework, such as 1,3-bis (3-glycidoxy propyl)-1,1,3,3-tetra methyl disiloxane, may also be used. Further examples include diepoxide compound such as (poly)ethylene glycol diglycidyl ether, (poly)propylene glycol diglycidyl ether, butanediol diglycidyl ether, neopentylglycol diglycidyl ether, and cyclohexanedimethanol diglycidyl ether; and triepoxide compound such as trimethylol propane triglycidyl ether and glycerin triglycidyl ether.

Among others, a liquid bisphenol type epoxy resin, a liquid amino phenol type epoxy resin, a silicone modified epoxy resin, and a naphthalene type epoxy resin may be preferable. A liquid bisphenol A epoxy resin, a liquid bisphenol F type epoxy resin, a p-amino phenol type liquid epoxy resin, and a 1,3-bis (3-glycidoxy propyl)tetra methyl disiloxane may be more preferable.

In the film adhesive according to the present invention, the ratio of phenol novolac type epoxy resin to the epoxy resin of component (A) is not less than 46%. If the ratio of the phenol novolac type epoxy resin to the epoxy resin of component (A) is less than 46%, thermal resistance, moisture resistance, and/or heat cycle resistance may be decreased.

The ratio of phenol novolac type epoxy resin to the epoxy resin of component (A) is preferably not less than 55% and more preferably not less than 60%.

As described above, the ratio of phenol novolac type epoxy resin is not less than 46%. Accordingly, the ratio of liquid epoxy resin to the epoxy resin of component (A) is not more than 54%. The ratio of liquid epoxy resin to the epoxy resin of component (A) is preferably not more than 45% and more preferably not more than 40%.

In the film adhesive according to the present invention, the content of component (A) is 19.3 to 33.8 parts by mass. If the content of component (A) is less than 19.3 parts by mass, thermal resistance and reflow resistance may be decreased due to a decrease in Tg. On the other hand, if the content of component (A) is greater than 33.8 parts by mass, the toughness of the film adhesive prior to curing may be decreased.

In the film adhesive according to the present invention, the content of component (A) is preferably 20 to 31 parts by mass, more preferably 20.5 to 26 parts by mass, and even more preferably 20.9 to 25.8 parts by mass.

In the film adhesive according to the present invention, the bisphenol F type phenoxy resin of component (B) is a film former component.

For reasons of mountability, the bisphenol F type phenoxy resin of component (B) has the softening point of preferably 50 to 110° C. and more preferably 60 to 100° C.

In the film adhesive according to the present invention, the content of component (B) is 7.5 to 9.1 parts by mass. If the content of component (B) is less than 7.5 parts by mass, sufficient film forming ability may not be obtained. As a result, film thickness uniformity and toughness may be decreased. On the other hand, if the content of component (B) is greater than 9.1 parts by mass, viscosity may become too high, and flowability may be decreased.

In the film adhesive according to the present invention, the content of component (B) is more preferably 7.8 to 9.1 and even more preferably 8.0 to 9.1 parts by mass.

In the film adhesive according to the present invention, the phenol resin-based curing agent of component (C) is a curing agent component for the epoxy resin of component (A).

Specific examples of the phenol resin-based curing agent of component (C) include a novolac type and a resol type. The resol type tends to cause a reaction associated with a generation of gas at the time of curing by heating, and, for the uses of the present invention, may become a source of development of voids. Accordingly, use of a novolac type which does not cause such reaction at the time of curing by heating may be preferable. Specific examples of the novolac type include: phenol novolac type phenol resin; cresol novolac resin; phenol aralkyl (including a phenylene or biphenylene framework) resin; naphthol aralkyl resin; triphenol methane resin; and dicyclopentadiene type phenol resin.

Among these, for reasons of chemical resistance and thermal resistance, a phenol novolac type phenol resin and a cresol novolac resin may be preferable, and a phenol novolac type phenol resin may be more preferable.

The film adhesive according to the present invention has an equivalent ratio of component (C) relative to component (A), i.e., an equivalent ratio of the phenol resin-based curing agent of component (C) relative to the unit equivalent of the epoxy group of the epoxy resin of (A) of 0.25 to 0.75 (hereafter referred to as the "equivalent ratio of component (C)"). If the equivalent ratio of component (C) is outside the range, delamination and the like may be easily caused due to a decrease in adhesion property and thermal resistance.

The film adhesive according to the present invention has the equivalent ratio of component (C) of preferably 0.25 to 0.71 and more preferably 0.3 to 0.71.

In the film adhesive according to the present invention, the modified imidazole compound of component (D) is a curing promoter component for the epoxy resin of component (A).

The modified imidazole compound of component (D) refers to a compound obtained by adducting imidazole with a urea or isocyanate compound and then blocking the surface with an isocyanate compound for encapsulation, or a compound obtained by adducting imidazole with an epoxy compound and then blocking the surface with an isocyanate compound for encapsulation. Concrete examples include Novacure HX3941HP, Novacure HXA3042HP, Novacure HXA3922HP, Novacure HXA3792, Novacure HX3748, Novacure HX3721, Novacure HX3722, Novacure HX3088, Novacure HX3741, Novacure HX3742, and Novacure HX3613 (trade names, by Asahi Kasei Chemicals Corporation); Amicure PN-40J (trade name, by Ajinomoto Fine-Techno Co., Inc.); and Fujicure FXR-1121 (trade name, by T&K TOKA Co., Ltd.).

In the film adhesive according to the present invention, the content of component (D) is 1.9 to 5 parts by mass. If the content of component (D) is outside the range, cure rate may be delayed or promoted. As a result, the mounting time may become longer, working time may become shorter, or other problems may arise.

In the film adhesive according to the present invention, the content of component (D) is preferably 1.9 to 4 parts by mass.

In the film adhesive according to the present invention, the silica filler of component (E) is added to increase the reliability of the mounted semiconductor package.

As component (E), a silica filler that has been surface-treated using a silane coupling agent and the like may be used. The surface-treated silica filler may be expected to provide the effect of preventing coagulation of the silica filler.

In the film adhesive according to the present invention, the content of component (E) is 30 to 60 parts by mass. If the content of component (E) is less than 30 parts by mass, reliability may be decreased during a heat cycle test and the like. On the other hand, if the content of component (E) is greater than 60 parts by mass, a decrease in flowability or transparency may be caused by an increase in viscosity.

The silica filler of component (E) has an average particle diameter of preferably 0.01 to 1 μm and more preferably 0.05 to 0.3 μm, for reasons of penetration into a narrow gap and optical transmittance. The shape of the filler is not particularly limited. The shape of the filler may be spherical, amorphous, and scale-like. When the shape of the filler is other than spherical, the average particle diameter of the filler means an average maximum diameter of the filler.

(F) Oxyquinoline

In the film adhesive according to the present invention, the oxyquinoline of component (F) is a flux activator component for the film adhesive used as NCF according to the present invention.

The film adhesive according to the present invention contains the oxyquinoline of component (F) as a flux activator. This makes it possible to obtain excellent electrical connectivity and its high reliability when the film adhesive according to the present invention is used as NCF.

In the film adhesive according to the present invention, the content of component (F) is 2.5 to 10 parts by mass. If the content of component (F) is less than 2.5 parts by mass, a decrease in connectivity, particularly solder wettability, for example, may be caused. On the other hand, if the content of component (F) is greater than 10 parts by mass, voids may develop more readily, for example.

In the film adhesive according to the present invention, the content of component (F) is preferably 3 to 9 parts by mass and more preferably 4 to 8 parts by mass.

(G) Butadiene-Acrylonitrile-Methacrylic Acid Copolymer

In the film adhesive according to the present invention, the butadiene-acrylonitrile-methacrylic acid copolymer of component (G) is a component for increasing the toughness of the film adhesive prior to curing. By increasing the toughness of the film adhesive prior to curing, the electrical connectivity of the film adhesive of the present invention and reliability thereof can be increased.

In the film adhesive according to the present invention, the content of component (G) is 0.7 to 2.3 parts by mass.

If the content of component (G) is less than 0.7 parts by mass, sufficient toughness of the film adhesive prior to curing may not be obtained, for example. On the other hand, if the content of component (G) is greater than 2.3 parts by mass, viscosity may be increased, whereby flowability may become insufficient.

The content of component (G) is preferably 0.7 to 2.3 parts by mass. The content of component (G) is even more preferably 0.9 to 2 parts by mass.

The film adhesive according to the present invention may contain the following components, in addition to components (A) to (G), as needed.

(H): Silane Coupling Agent

The film adhesive according to the present invention, when used as NCF, may contain a silane coupling agent as component (H) to increase the adhesion to the IC chip and the substrate.

As the silane coupling agent of component (H), various silane coupling agents may be used, such as an epoxy-based, an amino-based, a vinyl-based, a methacryl-based, an acrylic-based, and a mercapto-based silane coupling agent. Among these, an amino-based silane coupling agent is preferable for reasons of high adhesion, for example.

Specific examples of the amino-based silane coupling agent include: N-phenyl-3-amino propyl trimethoxysilane (trade name: KBM573, by Shin-Etsu Chemical Co., Ltd.); N-2-(aminoethyl)-3-amino propyl methyl dimethoxysilane (trade name: KBM602, by Shin-Etsu Chemical Co., Ltd.); N-2-(aminoethyl)-3-amino propyl trimethoxysilane (trade name: KBM603, by Shin-Etsu Chemical Co., Ltd.); 3-amino propyl trimethoxysilane (trade name: KBM903, by Shin-Etsu Chemical Co., Ltd.); 3-amino propyl triethoxysilane (trade name: KBE903, by Shin-Etsu Chemical Co., Ltd.); and 3-triethoxysilyl-N-(1,3-dimethyl-butylidene) propyl amine (trade name: KBE9103, by Shin-Etsu Chemical Co., Ltd.).

When a silane coupling agent is contained as component (H), the content of component (H) is preferably 0.3 to 0.6 parts by mass and more preferably 0.3 to 0.5 parts by mass.

(Other Compounding Agents)

The film adhesive according to the present invention may further contain components other than components (A) to (H) as needed. Specific examples of the additional components include an antifoam agent, a surface conditioner, a rheology conditioner, a coloring agent, a plasticizer, a dispersant, an antisettling agent, a thickening agent, and a delustering agent. The type and compounding amount of each of the compounding agents may be according to routine practice.

In the film adhesive according to the present invention, for reasons of flowability, film formability, and the like, the parts by mass of a liquid component relative to 100 parts by mass of a solid resin component included in the film adhesive is preferably 18 to 33 parts by mass, more preferably 18.5 to 32.8 parts by mass, and even more preferably 18.8 to 32.6 parts by mass.

Of the above-described components of the film adhesive, the solid resin component comprises the phenol novolac type epoxy resin as component (A), the bisphenol F type phenoxy resin as component (B), the phenol resin-based curing agent as component (C), the modified imidazole compound as component (D), the oxyquinoline as component (F), and the butadiene-acrylonitrile-methacrylic acid copolymer as component (G). The liquid resin component comprises the liquid epoxy resin as component (A), and the silane coupling agent as component (H).

In the film adhesive according to the present invention, for reasons of film formability and the like, the ratio of the content of the solid resin component included in the film adhesive relative to a total amount of component (A), component (B), component (C), component (D), and component (G) is preferably 70 to 85, more preferably 71 to 84, and even more preferably 72 to 83.

(Manufacture of Film Adhesive)

The film adhesive according to the present invention can be manufactured by a conventional method. For example, under the presence or absence of a solvent, component (A) to component (G), component (H) if contained, and additionally other compounding agents that may be compounded as needed are mixed by a heating vacuum mixing kneader, thereby preparing a resin composition.

The component (A) to component (G), component (H) if contained, and other compounding agents that may be compounded as needed are dissolved at a predetermined solvent concentration so as to achieve desired content ratios. Predetermined amounts of the contents are fed into a reaction oven heated to 10 to 80° C. While being rotated at a rotational speed of 100 to 1000 rpm, mixing is performed at normal pressure for three hours. Thereafter, mixing and stirring may be performed for another 3 to 60 minutes under a vacuum (maximum 1 Torr).

The resin composition prepared by the above procedure is diluted with solvent to prepare a varnish. The varnish is coated onto at least one side of a support member, and then dried. Thereafter, a film adhesive attached to the support member, or a film adhesive peeled from the support member is provided.

Examples of the solvent that may be used as the varnish include: ketones such as methyl ethyl ketone and methyl isobutyl ketone; aromatic solvents such as toluene and xylene; and high boiling point solvents such as di-octylphthalate and di-butylphthalate. The amount of the solvent used is not particularly limited, and an amount of solvent as conventionally used may be used. The amount of solvent used is preferably 20 to 90 mass % relative to the solid content.

The support member is not particularly limited. The support member is selected, as appropriate, in accordance with a desired form in the film adhesive manufacturing method. Examples include a metal foil of copper or aluminum, and a resin carrier film of polyester or polyethylene. When the film adhesive according to the present invention is provided in the form of a film peeled from the support member, the support member is preferably mold release-treated with a mold release agent of a silicone compound and the like.

The varnish coating method is not particularly limited. Examples include a slot die method, a gravure method, and a doctor coater method. The coating method is selected, as appropriate, in accordance with a desired film thickness and the like. The coating is performed so that the film formed after drying has a desired thickness. The thickness can be derived by a person skilled in the art from the content of the solvent.

The drying condition is not particularly limited. The drying condition is designed, as appropriate, in accordance with the type and amount of the solvent used in the varnish, the amount of varnish used, and the coating thickness, for example. Drying may be performed at 60 to 100° C. under an atmospheric pressure, for example.

Next, the characteristics of the film adhesive according to the present invention will be described.

The film adhesive according to the present invention is void-free. When a void observation is performed according to a procedure as will be described below with reference to Examples, no voids are observed.

As described above, due to IC chips becoming more miniaturized, the pitch between adjacent electrodes, and the gap between the IC and the substrate have become narrow. Accordingly, the presence of a void makes it more likely for a decrease in interconnect strength or a short-circuit defect between wires to occur. Because the film adhesive according to the present invention is void-free, such problems are not caused.

The film adhesive according to the present invention provides excellent electrical connectivity and its high reliability.

The film adhesive according to the present invention has high crack resistance. When a crack resistance evaluation is implemented according to a procedure which will be described below with reference to Examples, no development of cracks is observed.

The film adhesive according to the present invention has a satisfactory surface flatness. When a surface flatness evaluation is implemented according to a procedure which will be described below with reference to Examples, no presence of irregularities is observed.

The film adhesive according to the present invention can be mounted in a short time, thus providing high productivity.

The film adhesive according to the present invention also provides a flux effect, allowing for excellent connectivity by soldering.

The film adhesive according to the present invention, due to the above characteristics, is preferable as a NCF to be used when manufacturing, particularly, a semiconductor device including a copper bump.

Next, a procedure for using the film adhesive according to the present invention will be described.

When a semiconductor package is mounted using the film adhesive according to the present invention, the film adhesive of a desired shape is affixed at a position for mounting a semiconductor chip on a substrate, using a laminator and the like.

It is also possible to affix, using a laminator and the like, the film adhesive on a wafer with a semiconductor circuit formed thereon, and then cut out individual chips using a dicer and the like. The lamination condition is not particularly limited, and may include an appropriate combination of conditions of heating, pressurization, depressurization and the like. Particularly, in order to enable the affixing on fine irregularities without causing a defect such as voids, the heating temperature is preferably 40 to 120° C., the depressurization degree is not more than 50 kPa, and the pressure is not less than 0.5 MPa.

After the film adhesive is affixed by lamination and the like, the semiconductor chip is mounted at a chip mount position on the substrate by thermal pressure bonding, using a flip chip bonder and the like. The thermal pressure bonding condition is not particularly limited. The thermal pressure bonding condition may be selected, as appropriate, in accordance with the semiconductor chip size, bump material, the number of bumps and the like.

Preferably, the heating temperature is 50 to 300° C., duration is 1 to 20 seconds, and pressure is 5 to 450 N.

The semiconductor device according to the present invention is not particularly limited as long as it is a semiconductor device for which the film adhesive according to the present invention is used during the manufacture of the semiconductor device. A specific example of the semiconductor device according to the present invention is a semiconductor device having a flip chip structure. A flip chip has a protruding electrode called a bump. Via the electrode, the semiconductor is interconnected with an electrode on a substrate and the like. Examples of bump material include solder, gold, and copper. Examples of the substrate interconnected with the flip chip include a single-layer or stacked organic substrate of FR-4 and the like, and inorganic substrates of silicon, glass, and ceramic. A copper electrode, a gold-plated or tin-plated copper electrode, an electrode having a solder layer and the like may be used. Examples of the semiconductor device having the flip chip structure include: memory devices such as dynamic random access memory (DRAM); processor devices such as central processing unit (CPU) and graphics processing unit (GPU); light-emitting elements such as light emitting diode (LED); and driver ICs used for a liquid crystal display (LCD) and the like.

Due to the above-described characteristics of the film adhesive, the semiconductor device according to the present invention preferably includes a copper bump.

EXAMPLES

The present invention will be described below in detail with reference to Examples. The present invention, however, is not limited to the Examples.

Examples 1 to 13, Comparative Examples 1 to 14

A coating varnish was prepared by compounding various raw materials at the compounding ratios shown in the tables below. Components (A) to (C) were respectively dissolved in methyl ethyl ketone to a 50 wt % concentration. Thereafter, the solutions were mixed at predetermined compounding ratio. Then, predetermined amounts of components (E) to (H) were added and dispersed. After dispersion, component (D) was further added. The resultant mixture was stirred until uniformity is achieved. In this way, a coating varnish was prepared. The coating varnish was coated onto a mold release-treated polyethylene terephthalate (PET) having a thickness of 50 μm. From the coated varnish, methyl ethyl ketone was removed by drying at 80° C. for 10 minutes. In this way, a film having a thickness of 35 μm was fabricated. The numerical values concerning the compositions in the tables are indicated by parts by mass.

The components used for fabricating the film adhesive are the following.

(A) Epoxy resin
  (A1) Phenol novolac type epoxy resin (softening point of about 50° C.); trade name YDPN638 (by Nippon Steel & Sumikin Chemical Co., Ltd.)
  (A2) Liquid epoxy resin
    (A2a) Bisphenol A epoxy resin/bisphenol F type epoxy resin mixed type; trade name EXA835LV (by DIC Corporation)
    (A2b) Epoxy component of bisphenol A epoxy resin; trade name HX3088 (by Asahi Kasei E-materials Corp.)
(B) Bisphenol F type phenoxy resin; trade name FX-316 (by Nippon Steel & Sumikin Chemical Co., Ltd.)
(B') Bisphenol F type phenoxy resin; trade name 1256 (by Mitsubishi Chemical Corporation)
(C) Phenol resin-based curing agent
  Cresol novolac type phenol resin; trade name KA-1180 (by DIC Corporation)
(C') Ethylene glycol bisanhydro trimellitate; trade name TMEG-S (by New Japan Chemical Co., Ltd.)
(D) Modified imidazole compound
  Modified imidazole compound component of micro-capsule type modified imidazole compound; trade name HX3088 (by Asahi Kasei E-materials Corp.)
(E) Silica filler
  Trade name Sciqas (by Sakai Chemical Industry Co., Ltd.), average particle diameter 0.1 μm
(F) Oxyquinoline, by Wako Pure Chemical Industries, Ltd.
(F') Phenolphthalein, by Tokyo Chemical Industry Co., Ltd.
(G) butadiene-acrylonitrile-methacrylic acid copolymer
  Trade name XER-32C (by JSR Corporation)
(G') Butadiene-acrylonitrile copolymer
  Trade name N2205 (by JSR Corporation)
(H) Silane coupling agent
  Phenylaminopropylsilane; trade name KBM573 (by Shin-Etsu Chemical Co., Ltd.)

The films fabricated by the above-described procedure was evaluated as follows.

(Film Characteristics)

Crack resistance: The film formed on PET was cut by a film cutter into 10 mm widths. The presence or absence of development of breakage and the presence or absence of development of chipping in the film sides were confirmed. The evaluation results are shown in the tables below, in which the evaluations indicate the following:

Absence of development: Good
Presence of development: Poor

Surface flatness: The film formed on PET was visually observed. The presence or absence of development of a recess, and the presence or absence of development of a line were confirmed. The evaluations in the tables indicates the following.

Absence of development: Good
Presence of development: Poor

Using the film fabricated by the above procedure as an NCF, a semiconductor chip was mounted on a substrate according to the following procedure. The substrate used had a resistance value measuring pad and a solder resist opening portion. The semiconductor chip used had a copper bump of 7.3 mm square.

The substrate had been heated and dried in advance in a nitrogen atmosphere. After the heating and drying of the substrate were completed, the film fabricated by the above procedure was cut into an about 8 mm square and placed at the substrate chip mount position. Thereafter, lamination was performed using a laminator (trade name MLP500/600 by Meiki Co.,Ltd.). After lamination, interconnection was implemented using a flip chip bonder (trade name FCB3 by Panasonic Factory Solutions Company). After interconnection, post-curing was performed in a heating oven at 165° C. for 60 minutes.

Using a test piece including the semiconductor chip mounted on the substrate by the above procedure, the following evaluation was implemented.

(Voids (Initial))

C-SAM: Using a ultrasonic flaw detector, the state under the chip of the test piece fabricated according to the above procedure was observed. Test pieces in which voids were observed in an image were evaluated to be defective articles. Seven test pieces were evaluated. The results are shown in the tables below. The descriptions in the tables indicate the number of samples with abnormal values/the number of measured samples.

Plane polishing: The chip portion of the test piece fabricated according to the above procedure was removed by polishing. The solder resist opening portion was observed using a microscope. The test pieces in which voids were observed were evaluated to be defective articles. Two test pieces were evaluated. The results are shown in the tables below. The descriptions in the tables indicate the number of samples with abnormal values/the number of measured samples.

(Connection (Initial))

Resistance value: The resistance value of the test piece fabricated according to the above procedure was measured using the resistance value measuring pad provided on the substrate. The test pieces that indicated the resistance values of 28 to 32Ω were determined to be acceptable. The results are shown in the tables below. The descriptions in the tables indicate the number of samples with abnormal values/the number of measured samples. When all of the samples were acceptable, the connection state was evaluated to be good. Even if one sample was unacceptable, the connection state was evaluated to be poor.

Connection state: The chip portion of the test piece fabricated according to the above procedure was removed by polishing. The solder shape was observed from an upper face using an optical microscope. The test pieces in which wet spreading on the substrate electrode was confirmed was evaluated to be good. The test pieces in which no wet spreading was confirmed was evaluated to be poor. The wet spreading was determined depending on whether a spreading of the color of solder over the substrate electrode could be confirmed.

(Moisture Absorption Reflow)

Five of the test pieces used in the observation by C-SAM and the resistance value measurement according to the above procedures were left in an environment of 30° C./60% RH for 192 hours. Thereafter, the test pieces passed through a 260° C. reflow three times. After moisture absorption reflow was implemented, observation by C-SAM and resistance value measurement were implemented according to the procedures similar to those described above.

TABLE 1

|  | EXAMPLE 1 | EXAMPLE 2 | EXAMPLE 3 | EXAMPLE 4 | EXAMPLE 5 | EXAMPLE 6 | EXAMPLE 7 |
|---|---|---|---|---|---|---|---|
| (A1) | 16.0 | 12.8 | 18.2 | 16.0 | 16.0 | 16.0 | 16.0 |
| (A2a) | 6.2 | 6.2 | 6.2 | 6.2 | 6.2 | 6.2 | 3.8 |
| (A2b) | 1.9 | 1.9 | 1.9 | 1.9 | 1.9 | 1.9 | 5.5 |
| (B) | 8.5 | 8.5 | 8.5 | 9.1 | 8 | 7.5 | 8.5 |
| (B') |  |  |  |  |  |  |  |
| (C) | 6.4 | 9.6 | 4.2 | 6.4 | 6.4 | 6.4 | 6.4 |
| (C') |  |  |  |  |  |  |  |
| (D) | 3.1 | 3.1 | 3.1 | 3.1 | 3.1 | 3.1 | 1.9 |
| (E) | 50.0 | 50.0 | 50.0 | 50.0 | 50.0 | 50.0 | 50.0 |
| (F) | 6.2 | 6.2 | 6.2 | 6.2 | 6.2 | 6.2 | 6.2 |
| (F') |  |  |  |  |  |  |  |
| (G) | 1.3 | 1.3 | 1.3 | 0.7 | 1.8 | 2.3 | 1.3 |
| (G') |  |  |  |  |  |  |  |
| (H) | 0.4 | 0.4 | 0.4 | 0.4 | 0.4 | 0.4 | 0.4 |
| TOTAL | 100 | 100 | 100 | 100 | 100 | 100 | 100 |
| CURING AGENT EQUIVALENT RATIO ((C)/(A)) | 0.41 | 0.71 | 0.25 | 0.41 | 0.41 | 0.41 | 0.38 |
| LIQUID COMPONENT/100 PARTS BY MASS OF SOLID RESIN COMPONENT | 20.5 | 20.5 | 20.5 | 20.5 | 20.5 | 20.5 | 24.1 |
| FILM CHARACTERISTICS |  |  |  |  |  |  |  |
| CRACK RESISTANCE | good | good | good | good | good | good | good |
| SURFACE FLATNESS | good | good | good | good | good | good | good |
| VOIDS (INITIAL) |  |  |  |  |  |  |  |
| C-SAM | 0/7 | 0/7 | 0/7 | 0/7 | 0/7 | 0/7 | 0/7 |
| PLANE POLISHING | 0/2 | 0/2 | 0/2 | 0/2 | 0/2 | 0/2 | 0/2 |
| CONNECTION (INITIAL) |  |  |  |  |  |  |  |
| RESISTANCE VALUE | 0/7 | 0/7 | 0/7 | 0/7 | 0/7 | 0/7 | 0/7 |
| CONNECTION STATE | good | good | good | good | good | good | good |
| VOIDS (MOISTURE ABSORPTION REFLOW RESISTANCE) |  |  |  |  |  |  |  |
| C-SAM | 0/5 | 0/5 | 0/5 | 0/5 | 0/5 | 0/5 | 0/5 |
| CONNECTION (MOISTURE ABSORPTION REFLOW RESISTANCE) |  |  |  |  |  |  |  |
| RESISTANCE VALUE | 0/5 | 0/5 | 0/5 | 0/5 | 0/5 | 0/5 | 0/5 |

TABLE 2

|  | EXAMPLE 8 | EXAMPLE 9 | EXAMPLE 10 | EXAMPLE 11 | EXAMPLE 12 | EXAMPLE 13 |
|---|---|---|---|---|---|---|
| (A1) | 10.3 | 22.4 | 12.8 | 17.7 | 16.0 | 16.0 |
| (A2a) | 10 | 8.7 | 5 | 6.2 | 6.2 | 6.2 |
| (A2b) | 1.9 | 2.7 | 1.5 | 1.9 | 1.9 | 1.9 |
| (B) | 8.5 | 11.9 | 6.8 | 8.5 | 8.5 | 8.9 |
| (B') |  |  |  |  |  |  |
| (C) | 6.4 | 8.9 | 5.1 | 8.1 | 6.4 | 9.4 |
| (C') |  |  |  |  |  |  |
| (D) | 5 | 4.3 | 2.5 | 3.1 | 3.1 | 3.1 |
| (E) | 50.0 | 30.0 | 60.0 | 50.0 | 46.2 | 50.0 |
| (F) | 6.2 | 8.8 | 5 | 2.8 | 10 | 2.8 |
| (F') |  |  |  |  |  |  |

TABLE 2-continued

|  | EXAMPLE 8 | EXAMPLE 9 | EXAMPLE 10 | EXAMPLE 11 | EXAMPLE 12 | EXAMPLE 13 |
|---|---|---|---|---|---|---|
| (G) | 1.3 | 1.7 | 1 | 1.3 | 1.3 | 1.3 |
| (G') |  |  |  |  |  |  |
| (H) | 0.4 | 0.6 | 0.3 | 0.4 | 0.4 | 0.4 |
| TOTAL | 100 | 100 | 100 | 100 | 100 | 100 |
| CURING AGENT EQUIVALENT RATIO ((C)/(A)) | 0.45 | 0.41 | 0.41 | 0.49 | 0.41 | 0.6 |
| LIQUID COMPONENT/100 PARTS BY MASS OF SOLID RESIN COMPONENT FILM CHARACTERISTICS | 32.6 | 20.6 | 20.5 | 20.5 | 18.8 | 20.7 |
| CRACK RESISTANCE | good | good | good | good | good | good |
| SURFACE FLATNESS | good | good | good | good | good | good |
| VOIDS (INITIAL) |  |  |  |  |  |  |
| C-SAM | 0/7 | 0/7 | 0/7 | 0/7 | 0/7 | 0/7 |
| PLANE POLISHING CONNECTION (INITIAL) | 0/2 | 0/2 | 0/2 | 0/2 | 0/2 | 0/2 |
| RESISTANCE VALUE | 0/7 | 0/7 | 0/7 | 0/7 | 0/7 | 0/7 |
| CONNECTION STATE | good | good | good | good | good | good |
| VOIDS (MOISTURE ABSORPTION REFLOW RESISTANCE) |  |  |  |  |  |  |
| C-SAM | 0/5 | 0/5 | 0/5 | 0/5 | 0/5 | 0/5 |
| CONNECTION (MOISTURE ABSORPTION REFLOW RESISTANCE) |  |  |  |  |  |  |
| RESISTANCE VALUE | 0/5 | 0/5 | 0/5 | 0/5 | 0/5 | 0/5 |

TABLE 3

|  | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 | COMPARATIVE EXAMPLE 6 | COMPARATIVE EXAMPLE 7 |
|---|---|---|---|---|---|---|---|
| (A1) | 22.4 | 21.7 | 7.9 | 20.2 | 11.2 | 16.0 | 16.0 |
| (A2a) | 6.2 | 2.4 | 11.6 | 6.2 | 6.2 | 6.2 | 6.2 |
| (A2b) | 1.9 | 1.9 | 1.9 | 1.9 | 1.9 | 1.9 | 1.9 |
| (B) | 8.5 | 8.5 | 8.5 | 8.5 | 8.5 | 8.5 |  |
| (B') |  |  |  |  |  |  |  |
| (C) |  | 6.4 | 6.4 | 6.4 | 6.4 | 6.4 | 6.4 |
| (C') |  |  |  |  |  |  |  |
| (D) | 3.1 | 1.2 | 5.8 | 3.1 | 3.1 | 3.1 | 3.1 |
| (E) | 50.0 | 50.0 | 50.0 | 50.0 | 50.0 | 50.0 | 50.0 |
| (F) | 6.2 | 6.2 | 6.2 | 2 | 11 |  | 6.2 |
| (F') |  |  |  |  |  | 6.2 |  |
| (G) | 1.3 | 1.3 | 1.3 | 1.3 | 1.3 | 1.3 | 9.8 |
| (G') |  |  |  |  |  |  |  |
| (H) | 0.4 | 0.4 | 0.4 | 0.4 | 0.4 | 0.4 | 0.4 |
| TOTAL | 100 | 100 | 100 | 100 | 100 | 100 | 100 |
| CURING AGENT EQUIVALENT RATIO ((C)/(A)) | 0 | 0.38 | 0.47 | 0.35 | 0.51 | 0.41 | 0.41 |
| LIQUID COMPONENT/100 PARTS BY MASS OF SOLID RESIN COMPONENT FILM CHARACTERISTICS | 20.5 | 10.4 | 38.5 | 20.5 | 20.5 | 20.5 | 20.5 |
| CRACK RESISTANCE | good | good | good | good | good | good | good |
| SURFACE FLATNESS | good | good | good | good | good | poor | good |

TABLE 3-continued

|  | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 | COMPARATIVE EXAMPLE 6 | COMPARATIVE EXAMPLE 7 |
|---|---|---|---|---|---|---|---|
| VOIDS (INITIAL) | | | | | | | |
| C-SAM | 5/7 | 2/7 | 0/7 | 0/7 | 7/7 | 2/7 | 7/7 |
| PLANE POLISHING | 2/2 | 2/2 | 0/2 | 0/2 | 2/2 | 2/2 | 2/2 |
| CONNECTION (INITIAL) | | | | | | | |
| RESISTANCE VALUE | 0/7 | 0/7 | 5/7 | 0/7 | 0/7 | 0/7 | 7/7 |
| CONNECTION STATE | good | good | poor | poor | good | poor | poor |
| VOIDS (MOISTURE ABSORPTION REFLOW RESISTANCE) | | | | | | | |
| C-SAM | NOT EVALUATED | NOT EVALUATED | NOT EVALUATED | 0/5 | NOT EVALUATED | NOT EVALUATED | NOT EVALUATED |
| CONNECTION (MOISTURE ABSORPTION REFLOW RESISTANCE) | | | | | | | |
| RESISTANCE VALUE | NOT EVALUATED | NOT EVALUATED | NOT EVALUATED | 5/5 | NOT EVALUATED | NOT EVALUATED | NOT EVALUATED |

TABLE 4

|  | COMPARATIVE EXAMPLE 8 | COMPARATIVE EXAMPLE 9 | COMPARATIVE EXAMPLE 10 | COMPARATIVE EXAMPLE 11 | COMPARATIVE EXAMPLE 12 | COMPARATIVE EXAMPLE 13 | COMPARATIVE EXAMPLE 14 |
|---|---|---|---|---|---|---|---|
| (A1) | 19.0 | 16.0 | 16.0 | 16.0 | 16.0 | 15.0 | 16.0 |
| (A2a) | 6.2 | 6.2 | 6.2 | 6.2 | 6.2 | 6.2 | 6.2 |
| (A2b) | 1.9 | 1.9 | 1.9 | 1.9 | 1.9 | 1.9 | 1.9 |
| (B) | 8.5 | 8.5 | 9.3 | 7.3 |  | 8.5 | 9.8 |
| (B') | | | | | | | |
| (C) | 3.4 | 6.4 | 6.4 | 6.4 | 6.4 |  | 6.4 |
| (C') | | | | | | | |
| (D) | 3.1 | 3.1 | 3.1 | 3.1 | 3.1 | 3.1 | 3.1 |
| (E) | 50.0 | 50.0 | 50.0 | 50.0 | 50.0 | 50.0 | 50.0 |
| (F) | 6.2 | 6.2 | 6.2 | 6.2 | 6.2 | 6.2 | 6.2 |
| (F') | | | | | | | |
| (G) |  | 1.3 | | | | | |
| (G') | | | | | | | |
| (H) | 0.4 | 0.4 | 0.4 | 0.4 | 0.4 | 0.4 | 0.4 |
| TOTAL | 100 | 100 | 100 | 100 | 100 | 100 | 100 |
| CURING AGENT EQUIVALENT RATIO ((C)/(A)) | 0.19 | 0.41 | 0.41 | 0.41 | 0.41 | 0.28 | 0.41 |
| LIQUID COMPONENT/100 PARTS BY MASS OF SOLID RESIN COMPONENT | 20.5 | 21.1 | 20.5 | 20.5 | 20.5 | 20.5 | 20.5 |
| FILM CHARACTERISTICS | | | | | | | |
| CRACK RESISTANCE | good | good | good | good | good | good | good |
| SURFACE FLATNESS | good | good | good | good | good | poor | good |
| VOIDS (INITIAL) | | | | | | | |
| C-SAM | 0/7 | 1/7 | 0/7 | 0/7 | 0/7 | 7/7 | 0/7 |
| PLANE | 0/2 | 2/2 | 0/2 | 2/2 | 0/2 | 2/2 | 0/2 |

TABLE 4-continued

|  | COMPARATIVE EXAMPLE 8 | COMPARATIVE EXAMPLE 9 | COMPARATIVE EXAMPLE 10 | COMPARATIVE EXAMPLE 11 | COMPARATIVE EXAMPLE 12 | COMPARATIVE EXAMPLE 13 | COMPARATIVE EXAMPLE 14 |
|---|---|---|---|---|---|---|---|
| POLISHING CONNECTION (INITIAL) |  |  |  |  |  |  |  |
| RESISTANCE VALUE | 0/7 | 0/7 | 0/7 | 0/7 | 2/7 | 0/7 | 0/7 |
| CONNECTION STATE | good | good | good | poor | poor | good | good |
| VOIDS (MOISTURE ABSORPTION REFLOW RESISTANCE) |  |  |  |  |  |  |  |
| C-SAM | 5/5 | NOT EVALUATED | 3/5 | NOT EVALUATED | NOT EVALUATED | NOT EVALUATED | 3/5 |
| CONNECTION (MOISTURE ABSORPTION REFLOW RESISTANCE) |  |  |  |  |  |  |  |
| RESISTANCE VALUE | 3/5 | NOT EVALUATED | 2/5 | NOT EVALUATED | NOT EVALUATED | NOT EVALUATED | 3/5 |

Examples 1 to 13 each indicated satisfactory film characteristics (crack resistance, surface flatness). The evaluations of voids and connection of the test pieces fabricated according to the above procedure were good for both initial fabrication and after connective moisture absorption reflow. Examples 2 and 3 are the examples where the content of the phenol resin-based curing agent of component (C) had been changed. Examples 4 to 6 are examples where the content of the butadiene-acrylonitrile-methacrylic acid copolymer of component (G) had been changed. Examples 7 and 8 are examples where the content of the modified imidazole compound of component (D) had been changed. Examples 9 and 10 are examples where the content of the silica filler of component (E) had been changed. Examples 11 to 13 are examples where the content of the oxyquinoline of component (F) had been changed. Example 13 is an example where the content of the phenol resin-based curing agent of component (C) had been changed from Example 11.

Comparative Example 1 is an example that does not contain the phenol resin-based curing agent of component (C). The evaluation of voids in the initial creation of the test piece fabricated according to the above procedure was unacceptable. Accordingly, the evaluation after moisture absorption reflow was not implemented. Comparative Example 2 is an example where the content of the modified imidazole compound of component (D) was less than 1.9 parts by mass. The evaluation of voids in initial creation of the test piece fabricated according to the above procedure was unacceptable. Accordingly, the evaluation after moisture absorption reflow was not implemented. Comparative Example 3 is an example where the content of the modified imidazole compound of component (D) was more than 5 parts by mass. The evaluation of connection in initial creation of the test piece fabricated according to the above procedure was unacceptable. Accordingly, the evaluation after moisture absorption reflow was not implemented. Comparative Example 4 is an example where the content of the oxyquinoline of component (F) was less than 2.5 parts by mass. The evaluation of connection after moisture absorption reflow of the test piece fabricated according to the above procedure was unacceptable. Comparative Example 5 is an example where the content of the oxyquinoline of component (F) was more than 10 parts by mass. The evaluation of voids in initial creation of the test piece fabricated according to the above procedure was unacceptable. Accordingly, the evaluation after moisture absorption reflow was not implemented. Comparative Example 6 is an example where phenol phthalin was used as component (F') instead of the oxyquinoline of component (F). The evaluations of film surface flatness and voids in initial creation of the test piece fabricated according to the above procedure were unacceptable. Accordingly, the evaluation after moisture absorption reflow was not implemented. Comparative Example 7 is an example that did not contain the bisphenol F type phenoxy resin of component (B). The evaluations of voids and connection in initial creation of the test piece fabricated according to the above procedure were unacceptable. Accordingly, the evaluation after moisture absorption reflow was not implemented. Comparative Example 8 is an example where the equivalent ratio of the phenol resin-based curing agent of component (C) to the epoxy resin of component (A) was less than 0.25. The evaluations of voids and connection after moisture absorption reflow of the test piece fabricated according to the above procedure were unacceptable. Comparative Example 9 is an example where, instead of the butadiene-acrylonitrile-methacrylic acid copolymer of component (G), the butadiene acrylonitrile copolymer of component (G') was used. The evaluations of voids and connection in initial creation of the test piece fabricated according to the above procedure were unacceptable. Accordingly, the evaluation after moisture absorption reflow was not implemented. Comparative Example 10 is an example where the content of the butadiene-acrylonitrile-methacrylic acid copolymer of component (G) was less than 0.7 parts by mass. The evaluations of voids and connection after moisture absorption reflow of the test piece fabricated according to the above procedure were unacceptable. Comparative Example 11 is an example where the content of the butadiene-acrylonitrile-methacrylic acid copolymer of component (G) was more than 2.3 parts by mass. Of the evaluations of voids and connection in initial creation of the test piece fabricated according to the above procedure, the evaluation by plane polishing was unacceptable. Comparative Example 12 is an example where, instead of the bisphenol F type phenoxy resin of component (B), the bisphenol F type phenoxy resin of component (B') was used. The evaluation of connection in initial creation of the test piece fabricated according to the above procedure was unacceptable. Accordingly, the evaluation after moisture absorption reflow was not implemented. Comparative Example 13 is an example where, instead of the phenol resin-based curing agent of (C), the ethylene glycol bisanhydro trimellitate of component (C') was used. The evaluation of voids in initial creation of the test piece fabricated according to the above procedure was unacceptable. Accordingly, the evaluation after moisture absorption reflow was not implemented. Comparative Example 14 is an example that did not contain the butadiene-acrylonitrile-methacrylic acid copolymer of component (G). The evaluations of voids and connection after moisture absorption reflow of the test piece fabricated according to the above procedure were unacceptable.

The invention claimed is:

1. A film adhesive which contains:
(A) an epoxy resin;
(B) a bisphenol F type phenoxy resin;
(C) a phenol resin-based curing agent;
(D) a modified imidazole compound;
(E) a silica filler;
(F) oxyquinoline; and
(G) a butadiene-acrylonitrile-methacrylic acid copolymer, wherein:
the content of component (A) is 19.3 to 33.8 parts by mass;
the content of component (B) is 7.5 to 9.1 parts by mass;
the content of component (D) is 1.9 to 5 parts by mass;
the content of component (E) is 30 to 60 parts by mass;
the content of component (F) is 2.5 to 10 parts by mass;
the content of component (G) is 0.7 to 2.3 parts by mass;
the epoxy resin of component (A) contains a phenol novolac type epoxy resin and a liquid epoxy resin;
the phenol novolac type epoxy resin has a ratio of not less than 46% to the epoxy resin of component (A); and
component (C) has an equivalent ratio of 0.25 to 0.75 relative to component (A).

2. The film adhesive according to claim 1, further containing (H) a silane coupling agent.

3. The film adhesive according to claim 1, wherein the phenol resin-based curing agent of component (C) is a cresol novolac type phenol resin.

4. The film adhesive according to claim 1, wherein the film adhesive has a liquid component of 18 to 33 parts by mass relative to 100 parts by mass of a solid resin component contained in the film adhesive.

5. The film adhesive according to claim 1, wherein the film adhesive has a content ratio of 70 to 85 of a solid resin component relative to a total amount of component (A), component (B), component (C), component (D), and component (G).

6. A semiconductor device in which the film adhesive according to claim 1 is used as an NCF during the manufacturing of the semiconductor device.

7. The semiconductor device according to claim 6, comprising a copper bump.

8. The film adhesive according to claim 2, wherein the phenol resin-based curing agent of component (C) is a cresol novolac type phenol resin.

9. The film adhesive according to claim 2, wherein the film adhesive has a liquid component of 18 to 33 parts by mass relative to 100 parts by mass of a solid resin component contained in the film adhesive.

10. The film adhesive according to claim 3, wherein the film adhesive has a liquid component of 18 to 33 parts by mass relative to 100 parts by mass of a solid resin component contained in the film adhesive.

11. The film adhesive according to claim 8, wherein the film adhesive has a liquid component of 18 to 33 parts by mass relative to 100 parts by mass of a solid resin component contained in the film adhesive.

12. The film adhesive according to claim 2, wherein the film adhesive has a content ratio of 70 to 85 of a solid resin component relative to a total amount of component (A), component (B), component (C), component (D), and component (G).

13. The film adhesive according to claim 3, wherein the film adhesive has a content ratio of 70 to 85 of a solid resin component relative to a total amount of component (A), component (B), component (C), component (D), and component (G).

14. The film adhesive according to claim 8, wherein the film adhesive has a content ratio of 70 to 85 of a solid resin component relative to a total amount of component (A), component (B), component (C), component (D), and component (G).

15. A semiconductor device in which the film adhesive according to claim 2 is used as an NCF during the manufacturing of the semiconductor device.

16. A semiconductor device in which the film adhesive according to claim 3 is used as an NCF during the manufacturing of the semiconductor device.

17. A semiconductor device in which the film adhesive according to claim 8 is used as an NCF during the manufacturing of the semiconductor device.

* * * * *